US011774607B2

(12) United States Patent
Tomita et al.

(10) Patent No.: US 11,774,607 B2
(45) Date of Patent: Oct. 3, 2023

(54) SCINTILLATOR PANEL AND RADIATION IMAGING APPARATUS

(71) Applicant: CANON KABUSHIKI KAISHA, Tokyo (JP)

(72) Inventors: Taiji Tomita, Kanagawa (JP); Tomoyuki Oike, Kanagawa (JP); Tamaki Kobayashi, Kanagawa (JP); Masami Tsukamoto, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/814,900

(22) Filed: Jul. 26, 2022

(65) Prior Publication Data

US 2023/0046099 A1    Feb. 16, 2023

(30) Foreign Application Priority Data

Aug. 13, 2021    (JP) .................................. 2021-132067

(51) Int. Cl.
*G01T 1/20* (2006.01)
*H01L 27/146* (2006.01)

(52) U.S. Cl.
CPC .......... *G01T 1/2002* (2013.01); *G01T 1/2006* (2013.01); *H01L 27/14663* (2013.01)

(58) Field of Classification Search
CPC ................. G01T 1/2002; G01T 1/2006; H01L 27/14663
See application file for complete search history.

(56) References Cited

U.S. PATENT DOCUMENTS 8,648,311 B2    2/2014  Kobayashi et al.
9,551,796 B2    1/2017  Maeda et al.

FOREIGN PATENT DOCUMENTS

JP    2008-117589    * 10/2008  ............... G01T 1/20
JP    2016-061637 A    4/2016

* cited by examiner

*Primary Examiner* — Kiho Kim
(74) *Attorney, Agent, or Firm* — VENABLE LLP

(57) ABSTRACT

A scintillator panel is provided. The scintillator panel comprises: a support; a scintillator configured to generate light in accordance with incident radiation; a light reflecting layer arranged between the support and the scintillator and configured to reflect the light; a semi-transmissive layer arranged between the light reflecting layer and the scintillator and configured to reflect part of the light and transmit other part of the light; and an optical adjustment layer arranged between the light reflecting layer and the semi-transmissive layer and configured to make an optical distance between the light reflecting layer and the semi-transmissive layer become a length with which the light resonates.

15 Claims, 10 Drawing Sheets

FIG. 10

| | LIGHT REFLECTING LAYER | OPTICAL ADJUSTMENT LAYER | SEMI-TRANSMISSIVE LAYER | DQE(0) RELATIVE VALUE | MTF(2) RELATIVE VALUE |
|---|---|---|---|---|---|
| Comparative Example 1 | Al:120nm | - | - | 100 | 100 |
| Comparative Example 2 | Ag:120nm | - | - | 109 | 79 |
| Example 1 | Al:120nm | SiO$_2$:160nm | Ag:8nm | 97 | 130 |
| Example 2 | Al:120nm | SiO$_2$:160nm | Ag:6nm | 93 | 121 |
| Example 3 | Al:120nm | SiO$_2$:160nm | Ag:10nm | 94 | 127 |
| Example 4 | Al:120nm | SiO$_2$:160nm | Ag:12nm | 97 | 119 |

SCINTILLATOR PANEL AND RADIATION IMAGING APPARATUS

BACKGROUND OF THE INVENTION

Field of the Invention

The present invention relates to a scintillator panel and a radiation imaging apparatus.

Description of the Related Art

As a flat panel detector (FPD) used for radiation imaging in medical image diagnosis, non-destructive inspection, and the like, there is available an indirect conversion FPD that converts radiation passing through an object into light using a scintillator and detects light emitted by the scintillator with a light-receiving element. An FPD is required to clearly depict a smaller object for early detection of a lesion, a reduction in the size of medical equipment such as a stent embedded in the body, and the like. That is, the FPD is required to have a high modulation transfer function (MTF) and high detective quantum efficiency (DQE). According to Japanese Patent Laid-Open No. 2016-061637, when a scintillator layer is formed, the sharpness (MTF) is improved by improving the crystallinity in the early stage of formation of a columnar crystal and the luminance (DQE) is improved by arranging a reflecting layer on the opposite side of the scintillator layer to a sensor panel.

SUMMARY OF THE INVENTION

It is difficult to completely prevent light generated in a scintillator layer from diffusing among columnar crystals. In addition, providing a reflecting layer as disclosed in Japanese Patent Laid-Open No. 2016-061637 will increase the DQE but relatively increase the amount of scattering light components, resulting in a deterioration in MTF.

Some embodiments of the present invention provide a technique which suppresses a reduction in DQE and is advantageous in improving the MTF.

According to some embodiments, a scintillator panel comprising: a support; a scintillator configured to generate light in accordance with incident radiation; a light reflecting layer arranged between the support and the scintillator and configured to reflect the light; a semi-transmissive layer arranged between the light reflecting layer and the scintillator and configured to reflect part of the light and transmit other part of the light; and an optical adjustment layer arranged between the light reflecting layer and the semi-transmissive layer and configured to make an optical distance between the light reflecting layer and the semi-transmissive layer become a length with which the light resonates, is provided.

According to some other embodiments, a radiation imaging apparatus comprising: a scintillator configured to generate light in accordance with incident radiation; a light reflecting layer configured to reflect the light; a semi-transmissive layer arranged between the light reflecting layer and the scintillator and configured to reflect part of the light and transmit other part of the light; an optical adjustment layer arranged between the light reflecting layer and the semi-transmissive layer and configured to make an optical distance between the light reflecting layer and the semi-transmissive layer become a length with which the light resonates; and a sensor panel arranged on an opposite side of the scintillator to a side on which the light reflecting layer is arranged and configured to receive light emitted from the scintillator, is provided.

Further features of the present invention will become apparent from the following description of exemplary embodiments (with reference to the attached drawings).

BRIEF DESCRIPTION OF THE DRAWINGS

FIG. 10 is a view showing the characteristics of the scintillator panel in FIG. 1 and the scintillator panel according to the comparative example.

DESCRIPTION OF THE EMBODIMENTS

Figure 1:
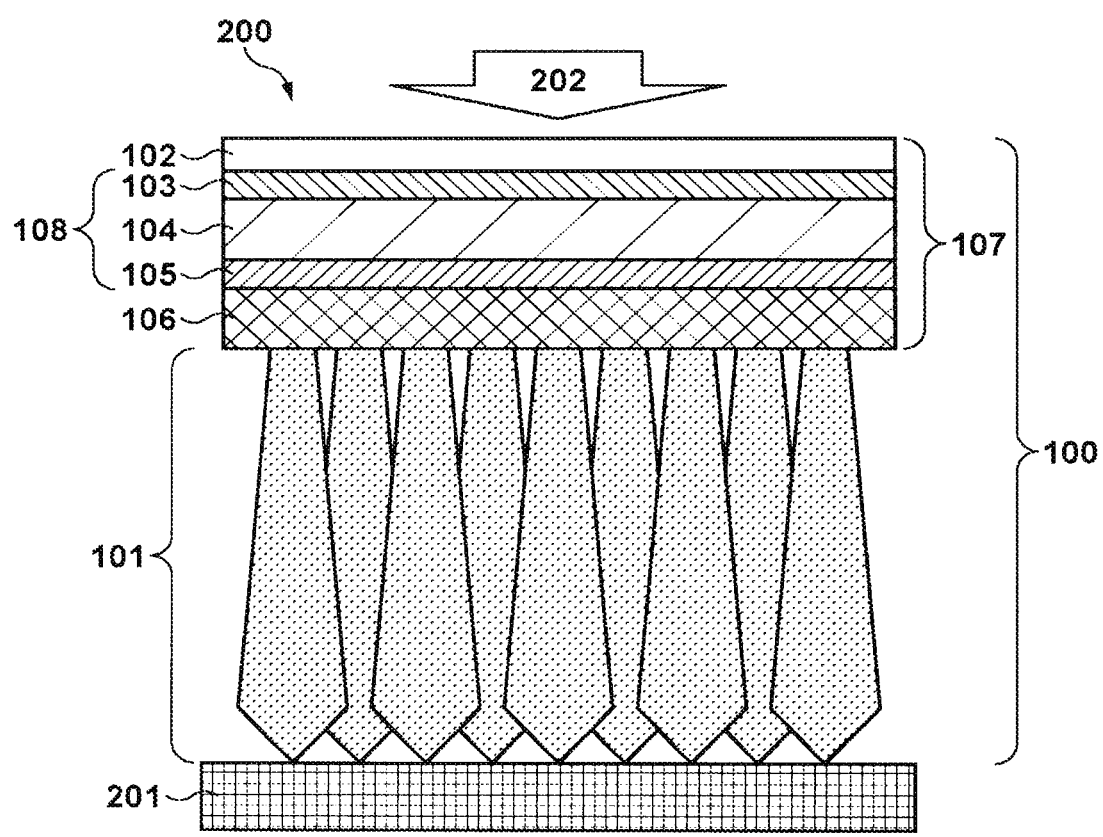
FIG. 1 is a view showing an example of the arrangement of a radiation imaging apparatus using a scintillator panel according to this embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

Note that radiation according to the present invention can include not only α-rays, β-rays, and γ-rays that are beams generated by particles (including photons) emitted by radioactive decay but also beams having energy equal to or higher than the energy of these beams, for example, X-rays, particle rays, and cosmic rays.

A scintillator panel according to this embodiment and a radiation imaging apparatus using the scintillator panel will be described with reference to FIGS. 1 to 10. FIG. 1 shows an example of the arrangement of a radiation imaging apparatus 200 using a scintillator panel 100 according to the embodiment. The radiation imaging apparatus 200 includes the scintillator panel 100 and a sensor panel 201 for receiving light emitted from a scintillator 101 of the scintillator panel 100. The sensor panel 201 includes a plurality of image sensing elements and converts an optical image output from the scintillator 101 into an electrical signal. As shown in FIG. 1, radiation 202 may be irradiated from a side of the scintillator panel 100 or the sensor panel 201.

As shown in FIG. 1, the scintillator panel 100 includes a support 102, a light reflecting layer 103, an optical adjustment layer 104, a semi-transmissive layer 105, and the scintillator 101. The scintillator 101 generates light in accordance with incident radiation. The light reflecting layer 103 is arranged between the support 102 and the scintillator 101 to reflect light emitted from the scintillator 101. The semi-transmissive layer 105 is arranged between the light reflecting layer 103 and the scintillator 101 to reflect part of light emitted from the scintillator 101 and transmit the other part of the light. The optical adjustment layer 104 is arranged between the light reflecting layer 103 and the semi-transmissive layer 105 to make the optical distance between the light reflecting layer 103 and the semi-transmissive layer 105 become a length with which light emitted from the scintillator 101 resonates. In this case, a combination of the support 102, the light reflecting layer 103, the optical adjustment layer 104, and the semi-transmissive layer 105 is sometimes called a light reflecting member 107. As shown in FIG. 1, a protective layer 106 may also be provided between the scintillator 101 and the semi-transmissive layer 105. In this case, the light reflecting member 107 may include the protective layer 106. The protective layer 106 will be described later.

The scintillator panel 100 (scintillator 101) is sealed with a protective film (not shown) to suppress the infiltration of moisture and suppress a deterioration in the characteristics of the scintillator 101. The protective film is not specifically limited as long as it has a moisture-proof property. Various materials can be used for the protective film. As a protective film, parylene (paraxylene-based polymer) film or the like may be used in consideration of moisture-proof property and coatability.

The support 102 is a member for holding the light reflecting layer 103, the optical adjustment layer 104, the semi-transmissive layer 105, and the protective layer 106 as the constituent elements of the light reflecting member 107. The arrangement shown in FIG. 1 transmits the radiation 202. Various materials can be used for the support 102 without any specific limitations as long as the materials can hold each constituent element of the light reflecting member 107 and transmit the radiation 202. For the support 102, for example, glass, amorphous carbon, a plastic, a metal, a composite material obtained by combining them, or the like can be used. When a metal member is used as the support 102, the support 102 can also have the function of the light reflecting layer 103 (to be described later).

The light reflecting layer 103 is arranged on the support 102. Providing the light reflecting layer 103 makes it possible to reflect light propagating from the scintillator 101 to the side opposite to the sensor panel 201 toward the sensor panel 201 and efficiently use light generated by the scintillator 101. That is, the detective quantum efficiency (DQE) can be improved.

For the light reflecting layer 103, a metal material such as silver (Ag), aluminum (Al), platinum (Pt), and gold (Au) may be used. The light reflecting layer 103 may be formed from one material or a plurality of types of materials. That is, the light reflecting layer 103 may contain at least one of silver, aluminum, platinum, gold, or the like. When, for example, a material containing silver having high reflectance as a main component is used for the light reflecting layer 103, the effect of this embodiment described below becomes more prominent. In this case, the main component of the light reflecting layer 103 is one of the materials constituting the light reflecting layer 103 which has the highest ratio of weight or molar ratio.

The light reflecting layer 103 can be formed by forming the above metal material on the support 102 by using a vapor deposition method, a sputtering method, or the like. The light reflecting layer 103 may be formed by using the sputtering method in consideration of reflectance, flatness, uniformity, and the like. In addition, as described above, a metal material such as aluminum or the like may be used for the support 102 to function as the light reflecting layer 103.

The optical adjustment layer 104 is arranged between the light reflecting layer 103 and the semi-transmissive layer 105 to make the optical distance between the light reflecting layer 103 and the semi-transmissive layer 105 become a length with which light emitted from the scintillator 101 resonates. More specifically, the optical adjustment layer 104 is a layer used to function as an optical resonator that maintains the reflectance of a specific wavelength (the peak wavelength of light emitted from the scintillator 101 in this embodiment) owing to the resonant effect of light and, at the same time, reduces the reflectance of light having other wavelengths. Various types of materials can be used for the optical adjustment layer 104 as long as the layer satisfies the following optical distance requirement particularly without any limitation.

An optical distance L [nm] of the optical adjustment layer 104 may satisfy inequality (1) given below.

$$(\lambda/4)\times(-1-(\varphi/\pi))<L<(\lambda/4)\times(1-(\varphi/\pi)) \quad (1)$$

where λ [nm] is the peak wavelength of light emitted from the scintillator 101, φ [rad] is the sum of phase shifts of light having the wavelength λ [nm] in the light reflecting layer 103 and the semi-transmissive layer 105, and φ is a negative value.

The optical distance L is determined by a refractive index n at the wavelength λ [nm] of the optical adjustment layer 104 and a film thickness l [nm] according to equation (2) given below.

$$L=n\times l \quad (2)$$

Therefore, the resonant wavelength can be adjusted by adjusting the film thickness l [nm] in accordance with the refractive index n of the material of the optical adjustment layer 104.

A transparent inorganic material, a transparent resin, or the like may be used for the optical adjustment layer 104. For example, the optical adjustment layer 104 may contain at least one of the following materials: silicon oxide ($SiO_2$), aluminum oxide ($Al_2O_3$), titanium oxide (IV) ($TiO_2$), tantalum oxide ($Ta_2O_5$), indium tin oxide (ITO), zinc oxide (ZnO, ZnO:Al, ZnO:Ga), acrylic resin (PMMA), polyethylene terephthalate (PET), polycarbonate (PC), or the like. As shown in FIG. 1, the optical adjustment layer 104 may have a single layer structure using the above materials. Although the optical adjustment layer 104 may have a multilayer structure using the above materials, the single layer structure can be designed more easily than the multilayer structure because of consideration to reflection at interfaces and the like.

The optical adjustment layer 104 can be formed by using a vapor deposition method, a sputtering method, a spin coating method, a slit coating method, a spraying method, or the like in accordance with the material used. The optical adjustment layer 104 may be formed by the sputtering method when a transparent inorganic material is used or may be formed by the spin coating method when a transparent resin is used, from the viewpoint of flatness, uniformity, and the like.

The semi-transmissive layer 105 is a very thin metal film and is a layer having both a function of transmitting light and a function of reflecting light. Part of light entering the semi-transmissive layer 105 from the scintillator 101 propagates through the semi-transmissive layer 105 and the optical adjustment layer 104 and is then reflected by the light reflecting layer 103. Part of the reflected light is reflected again by the semi-transmissive layer 105. This action produces the resonant effect of light, and the layer functions as an optical resonator that maintains the reflectance of light with a specific wavelength and, at the same time, reduces the reflectance of light with other wavelengths in accordance with the film thickness of the optical adjustment layer 104.

Like the light reflecting layer 103, the semi-transmissive layer 105 may contain at least one of silver, aluminum, platinum, gold, or the like. The semi-transmissive layer 105 may be formed from one material or a plurality of types of materials. For example, the semi-transmissive layer 105 may contain silver as a main component and has a thickness of 5 nm or more and 20 nm or less. In this case, the reason why the semi-transmissive layer 105 has a thickness of 5 nm or more is that the thin metal film containing silver as a main component tends to have an island shape as the film becomes too thin and fail to form a layer. Meanwhile, the reason why the semi-transmissive layer 105 has a thickness of 20 nm or less is that the transmittance of light becomes too low. That is, the ratio of light entering an optical resonator 108 constituted by the light reflecting layer 103, the optical adjustment layer 104, and the semi-transmissive layer 105 to the light emitted from the scintillator 101 decreases to weaken the effect of the optical resonator 108.

The semi-transmissive layer 105 can be formed by forming the above metal material on the optical adjustment layer 104 by the vapor deposition method, the sputtering method, or the like. When a thin metal layer having a thickness of about 5 nm is formed by the vapor deposition method, the grown metal has a strong tendency to have an island shape and fail to form a layer. The semi-transmissive layer 105 may be formed by using the sputtering method from the viewpoint of flatness and uniformity. In addition, since the semi-transmissive layer 105 is a thin film, the metal may be formed by using, for example, an atomic layer deposition (ALD) method.

The scintillator 101 converts radiation into light. In order to efficiently transfer emitted light to the sensor panel 201, a material obtained by slightly adding an activator agent to columnar crystals containing an alkali halide metal compound as a main component is widely used as the scintillator 101. The scintillator 101 has air gaps formed among the respective columnar crystals so that part of light is repeatedly totally reflected in the crystals due to the differences in refractive index between the crystals and air so as to efficiently guide the emitted light to the sensor panel 201.

As the scintillator 101, for example, an alkali halide metal compound such as sodium iodide (NaI), cesium iodide (CsI), or cesium bromide (CsBr) may be used. Of these materials, cesium iodide may be used because it has a relatively high change rate from radiation (X-rays) to visible light and a relatively low deliquescence.

The scintillator 101 with only cesium iodide is low in luminous efficacy, and hence various types of activator agents may be added to the scintillator in addition to cesium iodide as a phosphor base material. As activator agents, halogen compounds such as thallium (Tl), europium (Eu), indium (In), lithium (Li), kalium (K), rubidium (Rb), and sodium (Na) may be used. The scintillator 101 can be formed by depositing an activator agent together with cesium iodide. For example, thallium iodide (TlI) may be used as an activator agent. When the scintillator 101 is formed by using the vapor deposition method, the crystallinity of columnar crystals formed can be improved by placing a substrate vertically above a deposition source for a scintillator material so as to be oblique to the vertical axis, resulting in an improvement in MTF.

The scintillator 101 formed by slightly adding an activator agent to the columnar crystals formed from an alkali halide metal compound exhibits deliquescence. Accordingly, when the semi-transmissive layer 105 using a metal comes into contact with the scintillator 101, the semi-transmissive layer 105 may be subjected to problems such as corrosion. For this reason, the protective layer 106 is arranged between the semi-transmissive layer 105 and the scintillator 101.

For the protective layer 106, a transparent inorganic material, a transparent resin, or the like may be used. As a transparent inorganic material, for example, one or a plurality of materials may be selected from silicon oxide ($SiO_2$), aluminum oxide ($Al_2O_3$), titanium oxide (IV) ($TiO_2$), tantalum oxide ($Ta_2O_5$), and the like. In addition, as a transparent resin, for example, one or a plurality of materials selected from polyurethane resin, polyamide resin, polyimide resin, epoxy resin, acrylic resin, parylene, and the like may be used. Parylene has also a moisture-proof effect and is suitable for use for the protective layer 106 in consideration of corrosion and the like. In addition, the protective layer 106 may have a single layer structure or a multilayer structure formed by stacking layers using the above materials. For example, layers formed from a transparent inorganic material and a transparent resin may be stacked or layers formed from different types of transparent inorganic materials or different types of transparent resins may be stacked.

The protective layer 106 can be formed by using a vapor deposition method, a sputtering method, a spin coating method, a slit coating method, a spraying method, or the like in accordance with the material used. For example, a composite film formed by forming a transparent inorganic material using the sputtering method and then forming parylene using the vapor deposition method may be used as the protective layer 106. In this case, the film of the protective layer 106 which uses a transparent inorganic material is a film for mainly suppressing oxidation or fogging of the semi-transmissive layer 105 as a very thin metal film. Accordingly, the light reflecting layer 103, the optical adjustment layer 104, the semi-transmissive layer 105, and the transparent inorganic material film of the protective layer 106 may be consecutively formed by using the sputtering method. For example, films may be continuously and repeatedly deposited on the support 102 so as not to be exposed to the atmosphere in the sputtering apparatus in the interval between the formation of the light reflecting layer 103 and the formation of the transparent inorganic film of the protective layer 106.

The sensor panel 201 converts light converted from radiation by the scintillator panel 100 and light selectively resonated by the optical resonator 108 including the light reflecting layer 103, the optical adjustment layer 104, and the semi-transmissive layer 105 into electrical signals. The sensor panel 201 can include, for example, a PIN type image sensing elements or MIS type image sensing elements using amorphous silicon. The sensor panel 201 can have a two-dimensional array of pixels including photodiodes forming photoelectric conversion devices such as PIN type image sensing elements or MIS type image sensing elements. In addition, the sensor panel 201 can include a CMOS circuit such as an amplifier for processing electrical signals output from a plurality of pixels. The electrical signal obtained by the sensor panel 201 is sent to an external electrical board via a wiring structure such as an FPC (not shown) and is subjected to image processing and the like. This makes it possible to obtain a radiation image.

Figure 2:
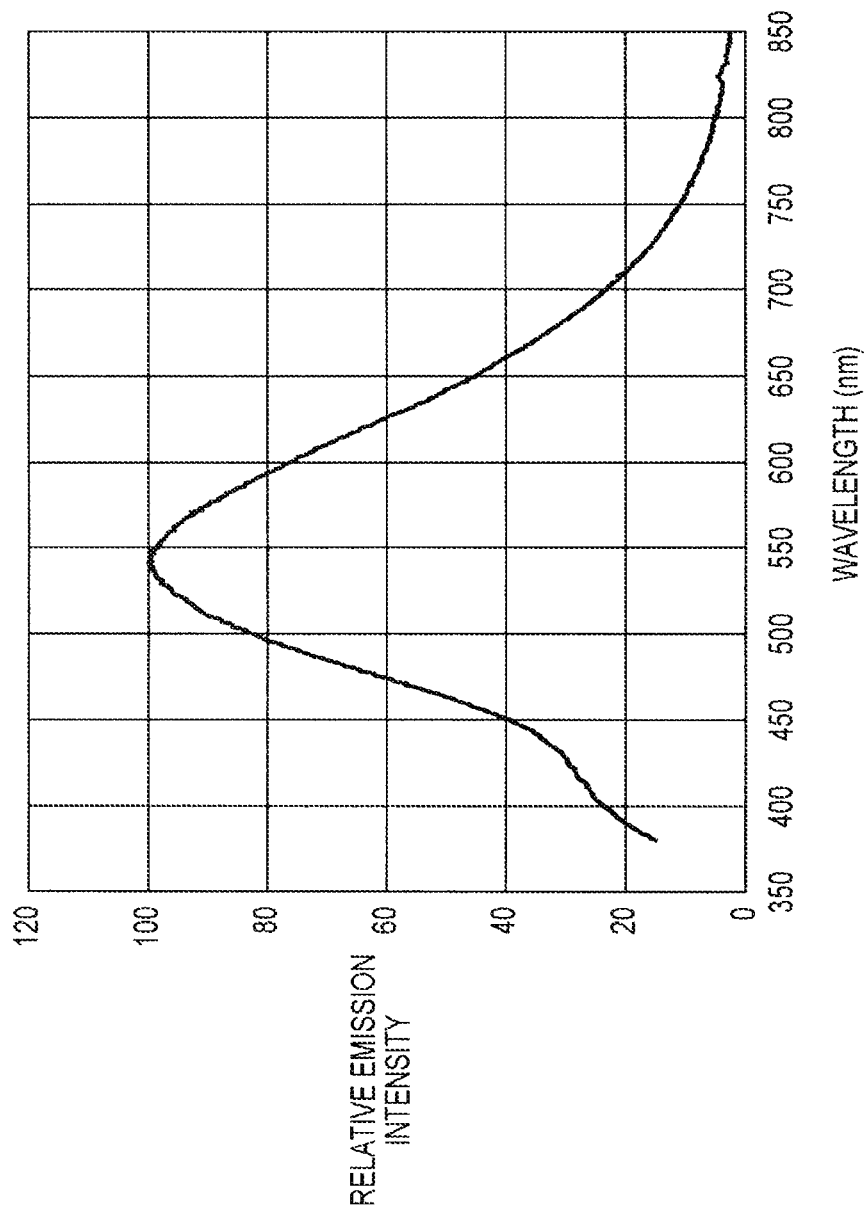
FIG. 2 is a graph showing an example of the emission spectrum of the scintillator used for the scintillator panel in FIG. 1.

The principle of improving the MTF while suppressing a reduction in DQE by using the scintillator panel 100 according to this embodiment will be described next with reference to FIGS. 2 to 6. FIG. 2 shows an example of the spectrum of light emitted from the scintillator 101. Assume in this description that the scintillator 101 is a scintillator (CsI:Tl) formed from needle-like crystals using cesium iodide as a base material and thallium iodide as an activator agent. As shown in FIG. 2, CsI:Tl used as the scintillator 101 has the peak wavelength of emission near 550 nm and a broad emission spectrum from about 300 nm on the wavelength side shorter than the peak wavelength to about 900 nm on the wavelength side longer than the peak wavelength.

Figure 3:
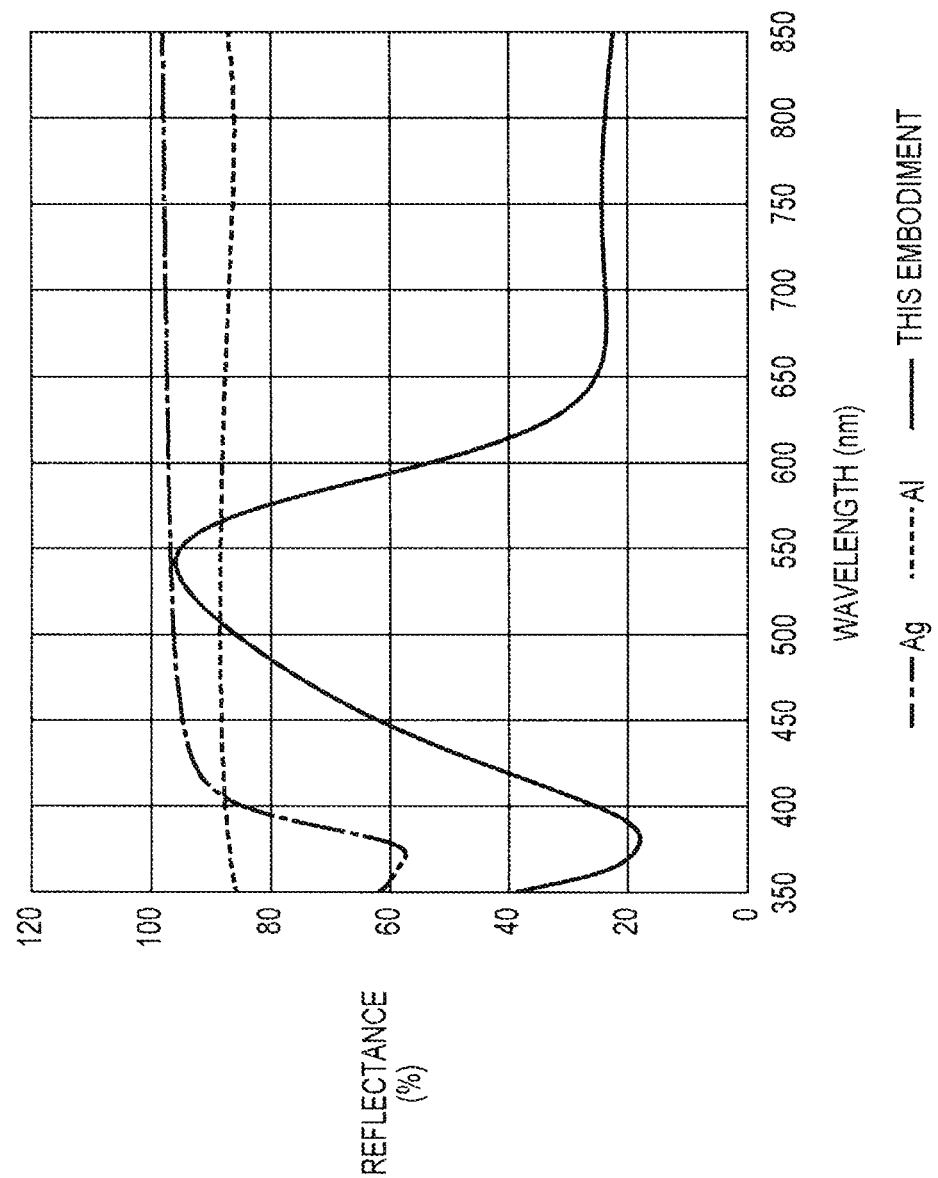
FIG. 3 is a graph showing the reflectances of the light reflecting members of the scintillator panel in FIG. 1 and a scintillator panel according to a comparative example at an incident angle of 5°.

FIG. 3 shows the reflectances of the light reflecting member 107 according to this embodiment and a light reflecting member according to a comparative example at an incident angle of 5°. In this case, the light reflecting member 107 according to the embodiment is a substrate formed by stacking silver as the light reflecting layer 103, a silicon oxide as the optical adjustment layer 104, a thin silver film as the semi-transmissive layer 105, and a silicon oxide as the protective layer 106 on the glass as the support 102 by the sputtering method. In contrast to this, the light reflecting member according to the comparative example is a substrate formed by depositing aluminum (Al in FIG. 3) or silver (Ag in FIG. 3) as the light reflecting layer 103 and a silicon oxide as the protective layer 106 on the glass as the support 102 by sputtering. That is, the light reflecting member according to the comparative example does not include the optical resonator 108 constituted by the light reflecting layer 103, the optical adjustment layer 104, and the semi-transmissive layer 105.

As is obvious from FIG. 3, the light reflecting member 107 according to this embodiment has a reflection peak near 550 nm which is the peak wavelength of light emitted from the scintillator 101 due to the optical resonator 108. In contrast to this, the light reflecting member according to the comparative example having no optical resonator has a broad reflectance with small changes due to wavelengths even if the light reflecting member uses aluminum or silver.

Figure 4:
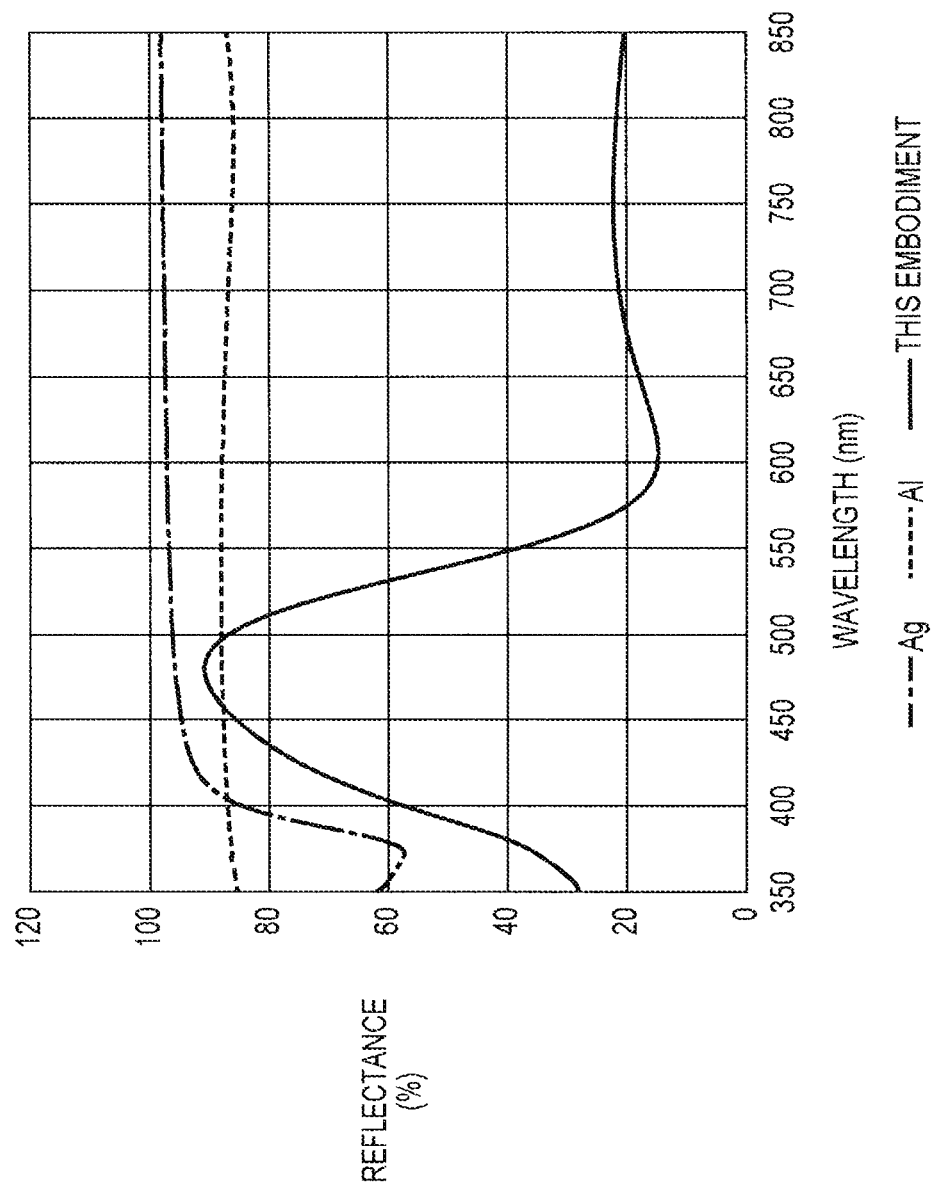
FIG. 4 is a graph showing the reflectances of the light reflecting members of the scintillator panel in FIG. 1 and the scintillator panel according to the comparative example at an incident angle of 45°.

FIG. 4 shows the reflectances of the light reflecting member 107 according to this embodiment and the light reflecting member according to the comparative example at an incident angle of 45°. FIG. 4 differs from FIG. 3 only in the incident angle of light.

As is obvious from FIG. 4, the light reflecting member 107 according to this embodiment has a reflection peak near 480 nm at an incident angle of 45°. Accordingly, the peak wavelength of light emitted from the scintillator 101 differs from the peak wavelength of reflection by the light reflecting member 107. Consequently, as compared with the case in which the incident angle of light is 5°, the intensity of reflected light decreases. In contrast to this, the light reflecting member 107 according to the comparative example has a broad reflectance even when the incident angle of light changes.

Figure 5:
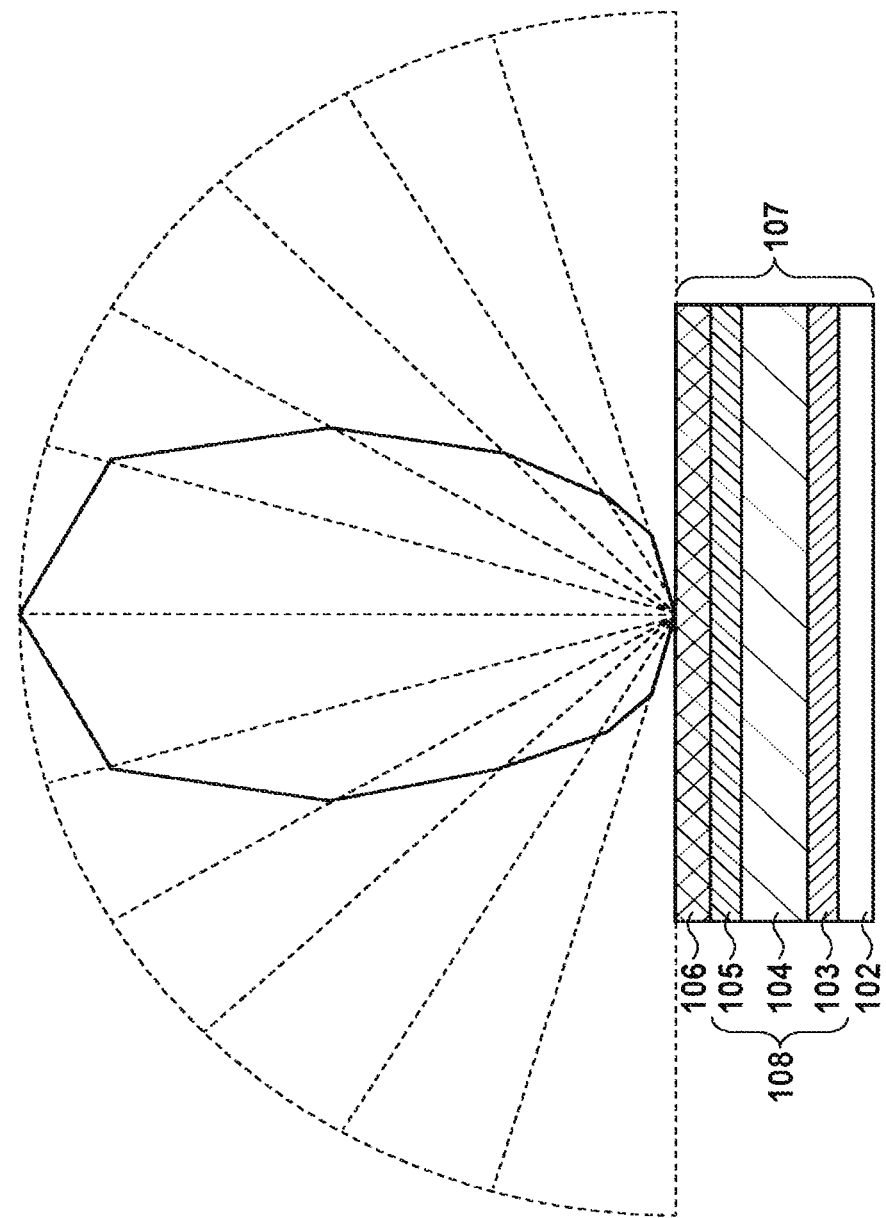
FIG. 5 is a view showing the angle dependence of reflected light from the light reflecting member of the scintillator panel in FIG. 1.

FIG. 5 shows the angle dependence of reflected light when light enters the light reflecting member 107 according to this embodiment from the scintillator 101. When the incident angle of light shifts from the normal direction of the light reflecting member 107 due to the characteristics of the optical resonator 108 constituted by the light reflecting layer 103, the optical adjustment layer 104, and the semi-transmissive layer 105 described above, the resonant (interference) wavelength shifts, resulting in a decrease in the intensity of reflected light. Accordingly, as shown in FIG. 5, the light reflecting member 107 according to this embodiment has reflection characteristics having directivity with high intensity of light reflected in the normal direction of the light reflecting member 107.

Figure 6:
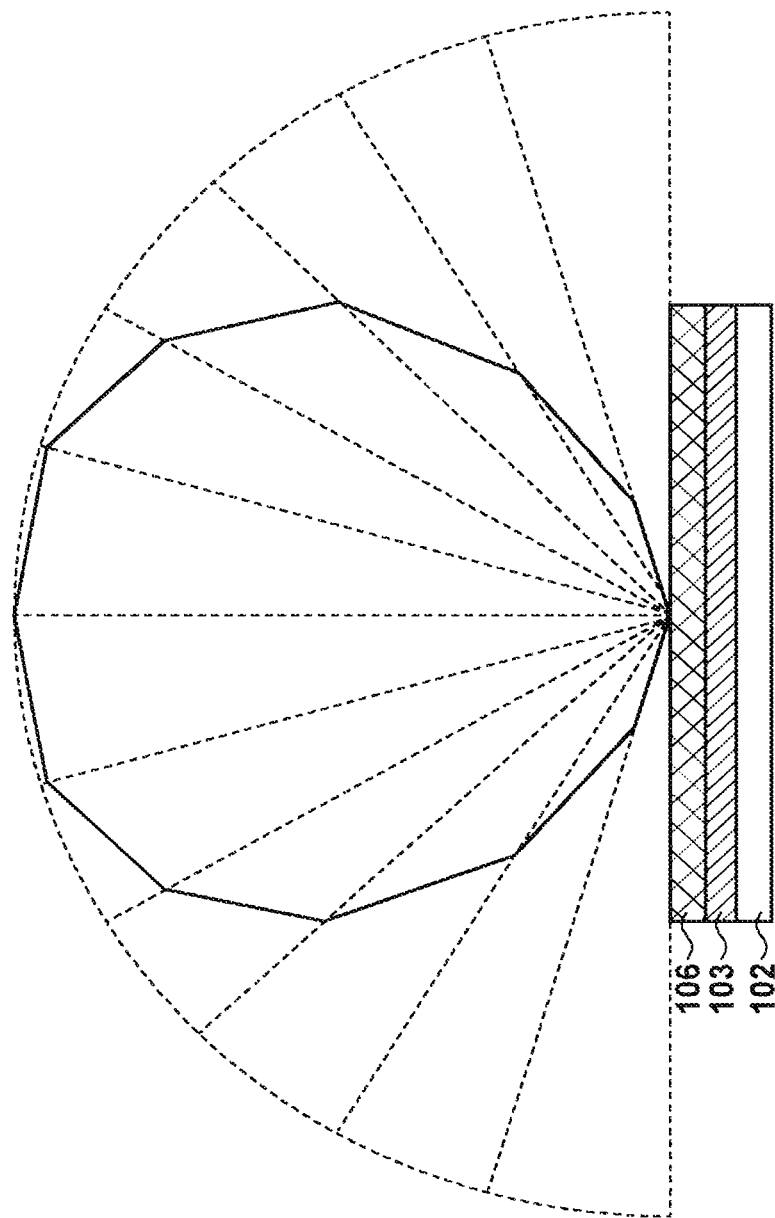
FIG. 6 is a view showing the angle dependence of reflected light from the light reflecting member of the scintillator panel according to the comparative example.

FIG. 6 shows the angle dependence of reflected light when light enters the light reflecting member according to the comparative example from the scintillator 101. The light reflecting member according to the comparative example scarcely has angle dependence of reflectance as shown in FIGS. 3 and 4, and hence has isotropic reflection characteristics as shown in FIG. 6.

As described above, when part of the light emitted from the scintillator 101 which is emitted to the light reflecting member 107 obliquely enters the normal direction of the light reflecting member 107 (that is, scattered light), the intensity of reflection is low. In contrast to this, light near the normal direction of the light reflecting member 107 is reflected with high reflectance. This allows the scintillator panel 100 including the light reflecting member 107 according to this embodiment to obtain high DQE by providing the light reflecting layer 103 and also achieve high MTF while reducing scattered light components.

The radiation imaging apparatus 200 shown in FIG. 1 has an arrangement in which the scintillator panel 100 is bonded to the sensor panel 201 through a bonding member such as an adhesive agent (not shown). The main component of the bonding member needs to have adhesion when bonding the scintillator panel 100 to the sensor panel 201. For example, as the main component, for example, a resin such as an acrylic resin, an epoxy-based resin, an olefin-based resin, or a silicon-based resin may be used. An acrylic resin having an optically high transmittance may be used as a bonding member. In addition, as a bonding member, a thermoplastic resin, a thermos-setting resin, or a heat melting solid hot melt resin (for example, a resin containing a polyolefin-based component, a polyester-based component, a polyamide-based component, or the like as a main component) may be used.

After the scintillator panel 100 is bonded to the sensor panel 201, the space in the side portions of the scintillator panel 100 and the sensor panel 201 bonded to each other may be filled with a resin material or the like (not shown). This prevents moisture from infiltrating into the side portions of the scintillator panel 100 and the sensor panel 201 bonded to each other, thereby suppressing a deterioration in the characteristics of the scintillator 101. The type of resin material to be used is not specifically limited as long as it has a moisture-proof property, and various types of materials can be used. For example, an epoxy resin can be used.

In this manner, the scintillator panel 100 including the light reflecting member 107 having the optical resonator 108 constituted by the light reflecting layer 103, the optical adjustment layer 104, and the semi-transmissive layer 105 is bonded to the sensor panel 201. This arrangement can implement the radiation imaging apparatus 200 that can improve the MTF while suppressing a reduction in DQE.

Figure 7:
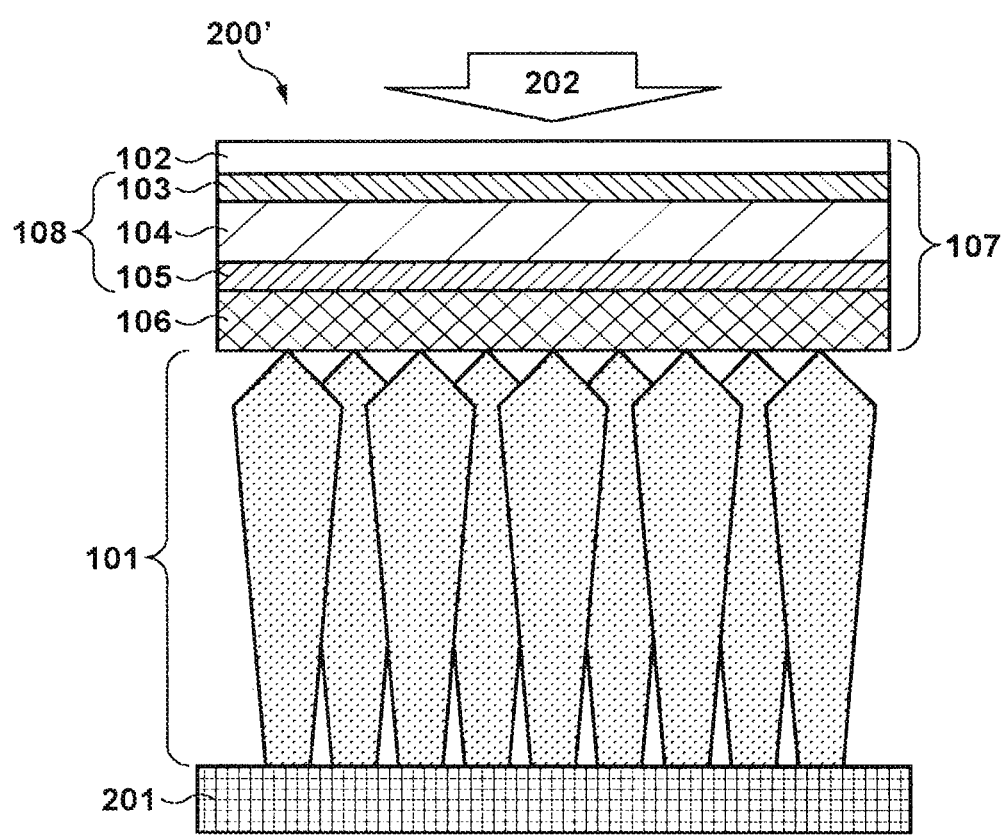
FIG. 7 is a view showing a modification of the radiation imaging apparatus in FIG. 1.

The radiation imaging apparatus 200 is not limited to the arrangement in which the scintillator panel 100 is bonded to the sensor panel 201. A radiation imaging apparatus 200' shown in FIG. 7 is obtained by directly forming the scintillator 101 on the sensor panel 201 by using the vapor deposition method or the like and then bonding the light reflecting member 107 including the optical resonator 108 to the scintillator 101. In any arrangement, the sensor panel 201 is arranged on the opposite side of the scintillator 101 to the optical resonator 108 constituted by the light reflecting layer 103, the optical adjustment layer 104, and the semi-transmissive layer 105.

As shown in FIG. 1, in the arrangement in which the scintillator panel 100 is bonded to the sensor panel 201, the scintillator 101 can be decreased in size from the sensor panel 201 toward the light reflecting member 107. In contrast to this, in the arrangement shown in FIG. 7, the scintillator 101 can be decreased in size from the light reflecting member 107 toward the sensor panel 201. That is, in the arrangement shown in FIG. 7, since the scintillator 101 is directly formed on the sensor panel 201, the scintillator 101 can have a structure obtained by vertically reversing the structure of the scintillator 101 shown in FIG. 1.

In the radiation imaging apparatus 200' having the arrangement shown in FIG. 7, the light reflecting member 107 is bonded to the scintillator 101 via a bonding member such as an adhesive agent (not shown). The same material as the bonding member used to couple the scintillator panel 100 to the sensor panel 201 described above can be used as the bonding member to couple the light reflecting member 107 to the scintillator 101.

In the radiation imaging apparatus 200' having the arrangement shown in FIG. 7, after the light reflecting member 107 is bonded to the scintillator 101, the space in the side portions of the light reflecting member 107 and the scintillator 101 bonded to each other may be filled with a resin material or the like (not shown). This prevents moisture from infiltrating into the side portions of the light reflecting member 107 and the scintillator 101 bonded to each other, thereby suppressing a deterioration in the characteristics of the scintillator 101. The type of resin material to be used is not specifically limited as long as it has a moisture-proof property, and various types of materials can be used. For example, an epoxy resin can be used.

Like the radiation imaging apparatus 200 shown in FIG. 1, the radiation imaging apparatus 200' shown in FIG. 7 is provided with the light reflecting member 107 including the optical resonator 108. This makes it possible to provide the radiation imaging apparatus 200' that can improve the MTF while suppressing a reduction in the DQE like the radiation imaging apparatus 200 described above.

The scintillator panel 100 according to the embodiment and a scintillator panel according to each comparative example will be described below. The comparative examples will be described first.

Comparative Example 1

As the support 102, a glass substrate was prepared. The light reflecting layer 103 using aluminum and the protective layer 106 (its part) using a silicon oxide were continuously deposited on the support 102 to 120 nm and 20 nm, respectively, by using the sputtering method. The protective layer 106 (its part) using parylene was a thickness of 12 μm and then deposited by using the vapor deposition method. The scintillator 101 having a columnar crystal structure containing cesium iodide as a main component and thallium iodide as an activator agent was formed on the light reflecting member according to Comparative Example 1 obtained in the above process by using the vapor deposition method, thereby obtaining a scintillator panel according to Comparative Example 1.

After the scintillator 101 was formed, the distal end side of the scintillator 101 was brought into close contact with a CMOS photodetector through a fiber optic plate (FOP), and the scintillator 101 was irradiated with X-rays complying with radiation quality RQA5 defined by the internal standards from the support 102 side. At this time, as a DQE value which is an index indicating noise from the scintillator 101 (scintillator panel), a DQE (0) value corresponding to a spatial frequency of 0 line pair per mm (0 Lp/mm) was 100, and the DQE (0) values obtained in Examples 1 to 4 and Comparative Example 2 (to be described later) were relatively compared with each other. In addition, as an MTF value which is an resolution index of the scintillator 101 (scintillator), a value corresponding to a spatial frequency of two line pairs per mm (2 Lp/mm) was obtained by an edge method using a tungsten knife-edge. The MTF (2) value at this time was 100, and the MTF (2) values obtained in Examples 1 to 4 and Comparative Example 2 (to be described later) were relatively compared with each other.

Comparative Example 2

As the support 102, a glass substrate was prepared. The light reflecting layer 103 using aluminum and the protective layer 106 (its part) using a silicon oxide were continuously deposited on the support 102 to 120 nm and 20 nm, respectively, by using the sputtering method. The protective layer 106 (its part) using parylene was then deposited by using the vapor deposition method. The scintillator 101 having a columnar crystal structure containing cesium iodide as a main component and thallium iodide as an activator agent was formed on the light reflecting member according to Comparative Example 2 obtained in the above process. That is, the scintillator panel according to Comparative Example 2 has the same structure as that of the scintillator panel according to Comparative Example 1 described above except that silver was used for the light reflecting layer 103. The prepared scintillator panel according to Comparative Example 2 was evaluated by using the same evaluation method as that used in Comparative Example 1.

Example 1

First of all, the film thickness of an optical adjustment layer 104 was estimated. In this case, a scintillator panel was designed assuming that silver was used for a light reflecting layer 103, a silicon oxide having high transmittance of light was used for the optical adjustment layer 104, silver was used for a semi-transmissive layer 105, and a silicon oxide was used for a portion of a protective layer 106 which was in contact with the semi-transmissive layer 105. When a refractive index n of the silicon oxide was 1.46 and a peak wavelength λ of light emitted from a scintillator 101 was 550 nm, a sum φ [rad] of phase shifts when light having the wavelength λ (550 nm) was reflected by the light reflecting layer 103 and the semi-transmissive layer 105 was about −π. Therefore, an optical distance L of the optical adjustment layer 104 is defined as follows according to inequality (1) given above.

$$0 \text{ nm} < L < 275 \text{ nm}$$

Accordingly, the film thickness of the silicon oxide of the optical adjustment layer 104 can be estimated as follows according to equation (2).

0 nm<l<188 nm

The reflectance of the light reflecting member 107 was estimated while the film thickness of the silicon oxide of the optical adjustment layer 104 was changed. Setting the film thickness of the silicon oxide of the optical adjustment layer 104 to 160 nm made it possible to prepare a light reflecting member 107 having a peak wavelength near 550 nm as shown in FIG. 3.

More specifically, the light reflecting layer 103 using silver with a thickness of 120 nm, the optical adjustment layer 104 using a silicon oxide with a thickness of 160 nm, the semi-transmissive layer 105 using silver with a thickness of 8 nm, and the protective layer 106 (its part) using a silicon oxide with a thickness of 20 nm were continuously deposited on the support 102 using a glass substrate by using the sputtering method. The protective layer 106 (its part) using parylene with a thickness of 12 μm was then deposited by using the vapor deposition method. The scintillator 101 having a columnar crystal structure containing cesium iodide as a main component and thallium iodide as an activator agent was formed on the light reflecting member 107 according to Example 1 obtained in the above process by using the vapor deposition method, thereby obtaining the scintillator panel 100 according to Example 1. The scintillator 101 is formed in Examples 2 to 4 in the same manner as in Comparative Examples 1 and 2.

Observing the formed scintillator 101 with a scanning electron microscope (SEM) made it possible to check the formation of the columnar crystal group. The film thickness of the obtained scintillator 101 was 860 μm. An analysis using an energy dispersive x-ray spectroscope (EDS) revealed that the thallium concentration with respect to the cesium iodide on the support 102 side of the scintillator 101 was 0.29 mol %, and the thallium concentration with respect to the cesium iodide on the sensor panel 201 side of the scintillator 101 was 1.40 mol %.

Figure 8:
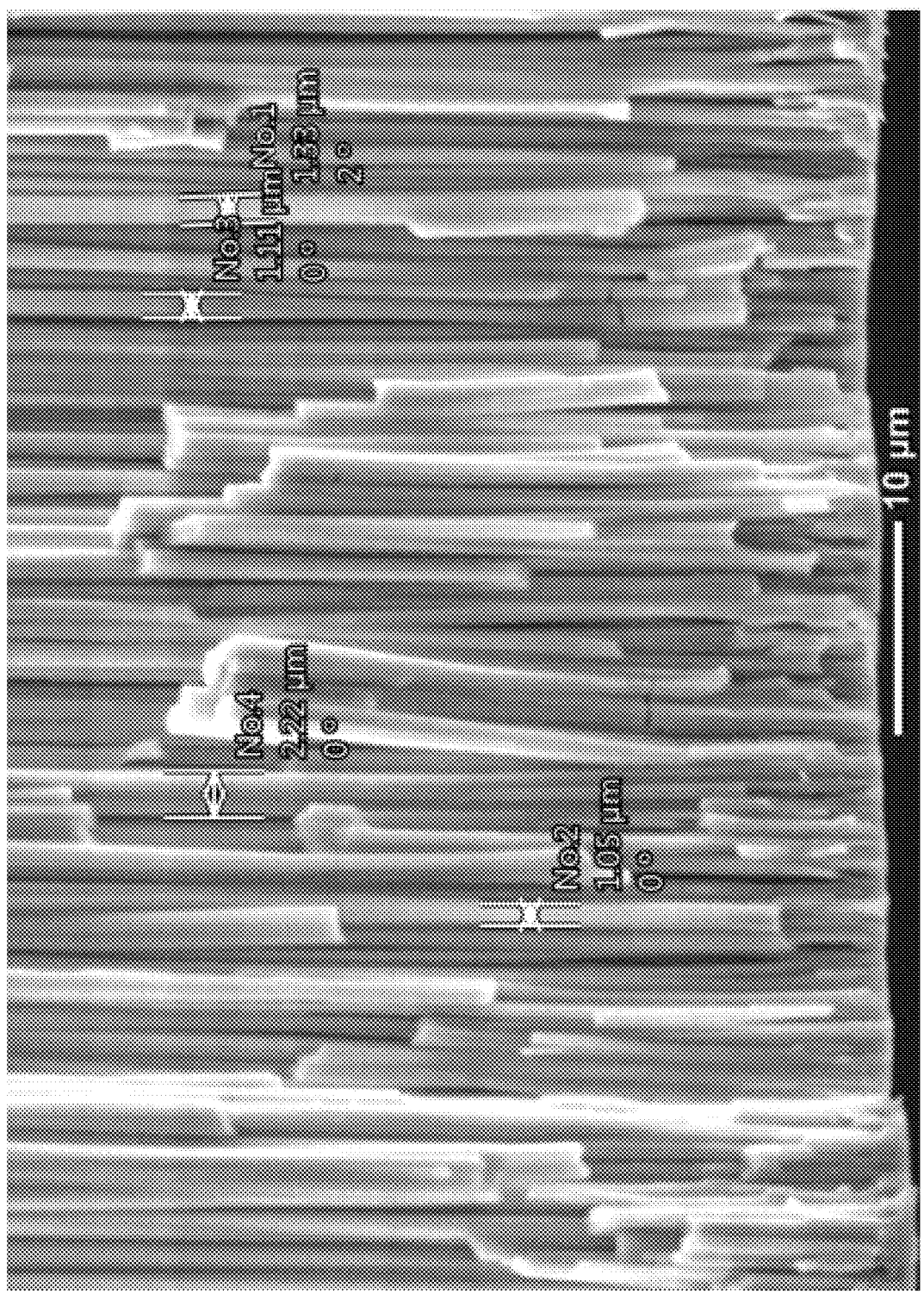
FIG. 8 is a view showing the scintillator used for the scintillator panel in FIG. 1.
Figure 9:
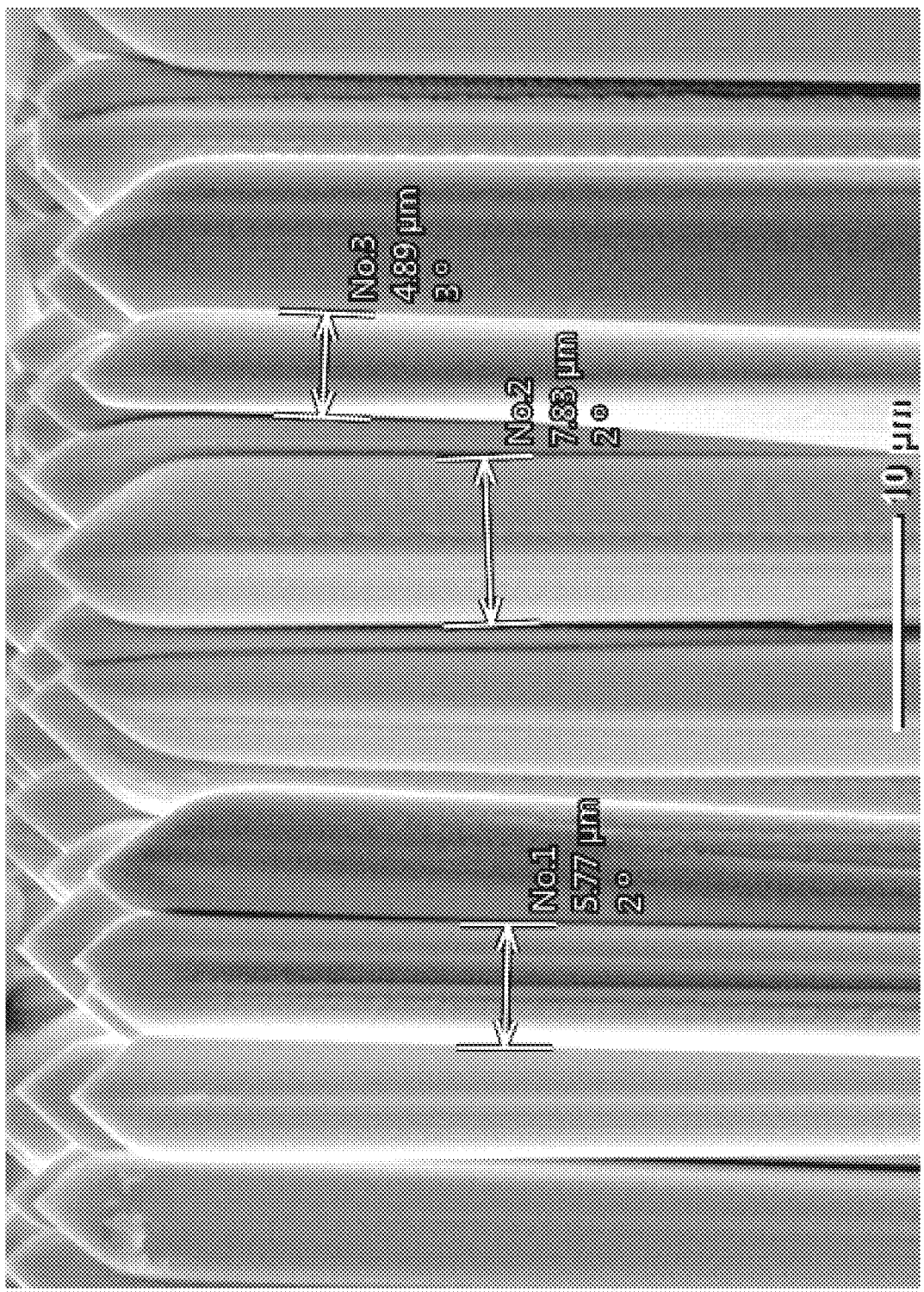
FIG. 9 is a view showing the scintillator used for the scintillator panel in FIG. 1.

FIG. 8 shows an SEM observation image of a portion of the scintillator 101 according to this embodiment which is located on the vapor deposition early stage side (support 102 side). FIG. 9 shows an SEM observation image of a portion of the scintillator 101 according to the embodiment which is located on the distal end side (sensor panel 201 side). Referring to FIGS. 8 and 9, each columnar crystal of the scintillator 101 on the vapor deposition early stage side had a thickness of about 1.0 μm to 2.2 μm in a direction (the direction of the arrows shown in FIGS. 8 and 9) intersecting the crystal growth direction. In contrast to this, each columnar crystal of the scintillator 101 on the distal end side had a thickness of 4.9 μm to 7.8 μm in the direction intersecting the crystal growth direction. As is obvious from FIGS. 8 and 9, the crystal size of the scintillator 101 on the vapor deposition early stage was smaller than the crystal size on the distal end side.

The scintillator panels 100 including the light reflecting members 107 prepared in Example 1 and Examples 2 to 4 (to be described below) were evaluated by the same evaluation method as that in Comparative Examples 1 and 2.

Example 2

The scintillator panel was prepared in the same manner as in Example 1 except that the silver used for a semi-transmissive layer 105 had a film thickness of 6 nm.

Example 3

The scintillator panel was prepared in the same manner as in Example 1 except that the silver used for a semi-transmissive layer 105 had a film thickness of 10 nm.

Example 4

The scintillator panel was prepared in the same manner as in Example 1 except that the silver used for a semi-transmissive layer 105 had a film thickness of 12 nm.

Scintillator panels 100 according to Examples 1 to 4 and the characteristics of scintillator panels according to Comparative Examples 1 and 2 will be described next with reference to FIG. 10. First of all, a comparison between the scintillator panels according to Comparative Examples 1 and 2 indicates that Comparative Example 2 using silver having a high reflectance for a light reflecting layer 103 obtained a higher DQE (0) value than Comparative Example 1. However, the MTF (2) value greatly decreased. This is because, although the light reflecting layer 103 of the scintillator panel according to Comparative Example 2 reflects more light, scattered light components relatively increase.

The scintillator panels 100 according to Examples 1 to 4 each exhibited an improvement in MTF (2) value as compared with the scintillator panel according to Comparative Example 1. In addition, the MTF (2) value depended on the film thickness of the silver used for the semi-transmissive layer 105 and exhibited the maximal value in Example 1 with a film thickness of 8 nm, which was 1.3 times larger than that in Comparative Example 1. It was found that the scintillator panel 100 according to Example 1 suppressed a reduction in DQE (0) value (−3%) as compared with the scintillator panel according to Comparative Example 1.

In the scintillator panel 100 according to Example 2 in which the film thickness of silver of the semi-transmissive layer 105 was 6 nm, which was smaller than that in the scintillator panel 100 according to Example 1, the MTF (2) value decreased more than in Example 1. Causes of a reduction in MTF (2) value may be that more components of light reflected by the light reflecting layer 103 were transmitted through the semi-transmissive layer 105, and the resonance generated in an optical resonator 108 constituted by the light reflecting layer 103, an optical adjustment layer 104, and the semi-transmissive layer 105 was weakened. In addition, causes of a reduction in MTF (2) value in Example 2 may be that because the film thickness of silver used for the semi-transmissive layer 105 was as thin as 6 nm, the silver was formed in an island shape, resulting in poor uniformity of the film of the semi-transmissive layer 105.

Even in the scintillator panels 100 according to Examples 3 and 4 in which the film thickness of silver used for the semi-transmissive layer 105 was larger than that in the scintillator panel 100 according to Example 1, the MTF (2) value became smaller than that in Example 1. Causes of the reduction may be that an increase in the film thickness of the semi-transmissive layer 105 decreased the amount of light entering the optical resonator 108 constituted by the light reflecting layer 103, the optical adjustment layer 104, and the semi-transmissive layer 105.

However, it was found that the scintillator panels 100 according to Examples 1 to 4 can improve the MTF while suppressing a reduction in DQE as compared with the scintillator panels according to Comparative Examples 1 and 2 which do not include the optical resonator 108. That is, the radiation imaging apparatus 200 according to this embodiment (Example 1) using the scintillator panel 100 including the optical resonator 108 constituted by the light reflecting layer 103, the optical adjustment layer 104, and the semi-transmissive layer 105 and the radiation imaging apparatus 200' including the optical resonator 108 can improve the MTF while suppressing a reduction in DQE.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-132067, filed Aug. 13, 2021, which is hereby incorporated by reference herein in its entirety.

What is claimed is:

1. A scintillator panel comprising:
a support;
a scintillator configured to generate light in accordance with incident radiation;
a light reflecting layer arranged between the support and the scintillator and configured to reflect the light;
a semi-transmissive layer arranged between the light reflecting layer and the scintillator and configured to reflect a part of the light and transmit another part of the light; and
an optical adjustment layer arranged between the light reflecting layer and the semi-transmissive layer and configured to make an optical distance between the light reflecting layer and the semi-transmissive layer become a length with which the light resonates.

2. The scintillator panel according to claim 1, wherein the optical adjustment layer has an optical distance L [nm] satisfying:

$$(\lambda/4) \times (-1-(\varphi/\pi)) < L < (\lambda/4) \times (1-(\varphi/\pi)),$$

where $\lambda$ [nm] is a peak wavelength of the light and $\varphi$ [rad] is a sum of phase shifts of light with the wavelength $\lambda$ [nm] in the light reflecting layer and the semi-transmissive layer.

3. The scintillator panel according to claim 1, wherein the optical adjustment layer comprises a transparent inorganic material or a transparent resin.

4. The scintillator panel according to claim 3, wherein the optical adjustment layer contains at least one selected from the group consisting of silicon oxide, aluminum oxide, titanium oxide, tantalum oxide, indium tin oxide, zinc oxide, acrylic resin, polyethylene terephthalate, and polycarbonate.

5. The scintillator panel according to claim 1, wherein the optical adjustment layer has a single layer structure.

6. The scintillator panel according to claim 1, wherein the light reflecting layer contains at least one selected from the group consisting of silver, aluminum, platinum, and gold.

7. The scintillator panel according to claim 1, wherein the semi-transmissive layer contains at least one selected from the group consisting of silver, aluminum, platinum, and gold.

8. The scintillator panel according to claim 1, wherein the semi-transmissive layer contains silver and has a thickness of 5 nm to 20 nm.

9. The scintillator panel according to claim 1, wherein the scintillator includes a columnar crystal containing an alkali halide metal compound as a main component.

10. The scintillator panel according to claim 1, further comprising a protective layer between the scintillator and the semi-transmissive layer.

11. The scintillator panel according to claim 10, wherein the protective layer comprises a transparent inorganic material or a transparent resin.

12. The scintillator panel according to claim 11, wherein the protective layer contains at least one selected from the group consisting of silicon oxide, aluminum oxide, titanium oxide, tantalum oxide, indium tin oxide, zinc oxide, polyurethane resin, polyamide resin, polyimide resin, epoxy resin, acrylic resin, and parylene.

13. The scintillator panel according to claim 10, wherein the protective layer has a multilayer structure.

14. A radiation imaging apparatus comprising:
the scintillator panel according to claim 1; and
a sensor panel configured to receive light emitted from the scintillator.

15. A radiation imaging apparatus comprising:
a scintillator configured to generate light in accordance with incident radiation;
a light reflecting layer configured to reflect the light;
a semi-transmissive layer arranged between the light reflecting layer and the scintillator and configured to reflect a part of the light and transmit another part of the light;
an optical adjustment layer arranged between the light reflecting layer and the semi-transmissive layer and configured to make an optical distance between the light reflecting layer and the semi-transmissive layer become a length with which the light resonates; and
a sensor panel arranged on an opposite side of the scintillator to a side on which the light reflecting layer is arranged and configured to receive light emitted from the scintillator.

* * * * *